United States Patent
Dei et al.

(10) Patent No.: US 6,693,360 B1
(45) Date of Patent: Feb. 17, 2004

(54) STATIC TYPE SEMICONDUCTOR MEMORY DEVICE

(75) Inventors: Makoto Dei, Hyogo (JP); Yasuhiro Fujii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/383,051

(22) Filed: Mar. 7, 2003

(30) Foreign Application Priority Data

Oct. 3, 2002 (JP) ..................................... 2002-290801

(51) Int. Cl.[7] .......................... H01L 23/48; H01L 23/52
(52) U.S. Cl. .................... 257/774; 257/750; 257/758; 257/773; 257/775
(58) Field of Search ............................. 257/774, 750, 257/758, 773, 775, 296, 300

(56) References Cited

U.S. PATENT DOCUMENTS

| | | | |
|---|---|---|---|
| 4,879,257 A | * 11/1989 | Patrick | 438/624 |
| 5,394,001 A | * 2/1995 | Yamaguchi et al. | 257/315 |
| 6,281,073 B1 | * 8/2001 | Lee | 438/255 |
| 6,429,521 B1 | * 8/2002 | Wada et al. | 257/758 |
| 6,458,692 B1 | * 10/2002 | Kim | 438/639 |
| 6,551,877 B1 | * 4/2003 | Wu | 438/256 |
| 6,580,130 B1 | * 6/2003 | Schoellkopf et al. | 257/350 |
| 6,586,804 B2 | * 7/2003 | Choi et al. | 257/374 |

FOREIGN PATENT DOCUMENTS

| | | |
|---|---|---|
| JP | 1-256152 | 10/1989 |
| JP | 2-142161 | 5/1990 |
| JP | 10-270555 | 10/1998 |

* cited by examiner

*Primary Examiner*—Jasmine Clark
(74) *Attorney, Agent, or Firm*—McDermott, Will & Emery

(57) ABSTRACT

A memory cell of a static type semiconductor memory device includes a gate electrode of an MOS transistor formed on a main surface of semiconductor substrate via an insulator film, an interlayer insulator film covering the gate electrode, a set of contact holes provided in the interlayer insulator film and reaching a source and a drain located on either side of the gate electrode, a plug portion formed within each contact hole, and a metal interconnection formed on each plug portion. A space between contact holes located in the interlayer insulator film is made smaller than a space between contact holes on a surface of the interlayer insulator film.

12 Claims, 14 Drawing Sheets

STATIC TYPE SEMICONDUCTOR MEMORY DEVICE

BACKGROUND OF THE INVENTION

1. Field of the Invention

The present invention relates to a static type semiconductor memory device (SRAM: Static Random Access Memory) and, more specifically, to a structure of connection between conductive layers in the SRAM.

2. Description of the Background Art

There is a kind of memory cell of the SRAM which includes two access MOS (Metal Oxide Semiconductor) transistors, two driver MOS transistors and two load MOS transistors. In such a memory cell, a flip-flop circuit is formed with the two load MOS transistors and two driver MOS transistors.

Two storage nodes cross-coupled by the flip-flop circuit are formed. The two storage nodes have a bistable state of (H (high) level, L (low) level) or (L level, H level). The bistable state is maintained as long as a prescribed power supply potential is provided.

Generally, a source or a drain of each MOS transistor described above is connected to an upper-layer interconnection. The upper-layer interconnection can connect to the source or drain via a contact hole. Conventional contact holes, each connecting an upper-layer interconnection and a substrate, are implemented with various shapes.

Japanese Patent Laying-Open No. 1-256152, for example, describes a semiconductor device having an interlayer insulator film provided with a contact hole having, at least on its portion, a sidewall which is tapered from the bottom to the surface.

Japanese Patent Laying-Open No. 10-270555 also describes a semiconductor device including an interlayer insulator film formed on an underlying layer of semiconductor with a plurality of layers having different etching rates and a contact formed in an opening provided in the interlayer insulator film and reaching the underlying layer of semiconductor, wherein the contact is expanded in a radial direction in a portion of the interlayer insulator film adjacent to the underlying layer of semiconductor.

Japanese Patent Laying-Open No. 2-142161 also describes a semiconductor device in which a concave and convex portion is formed on a sidewall of a removal portion which is formed by selectively removing a portion of an insulator film provided on a substrate, and a metal film provided on the removal portion engages with the insulator film.

On the other hand, a phenomenon in which a memory state is inverted (this phenomenon is referred to as a "soft error" hereafter) may occur with flow or injection of charge between a storage node and a substrate by carriers generated by an α ray due to a size reduction of the SRAM, a decrease in an operation voltage or a decrease in a storage node capacity.

One of measures against this soft error is to add a capacity to a storage node. It is expected that, by increasing a capacity between the storage node and a ground or between the storage node and a voltage supply unit, for example, a ratio of a change in charge to the storage node by the α ray is decreased, and thus the soft error can be reduced.

SUMMARY OF THE INVENTION

Therefore, an object of the present invention is to provide a static type semiconductor memory device highly resistant to a soft error by adding a capacity to a storage node.

A static type semiconductor memory device according to the present invention includes a memory cell, first and second conductive portions formed within the memory cell, an interlayer insulator film covering the first and second conductive portions, first and second connection holes provided in the interlayer insulator film and reaching the first and second conductive portions, first and second plug portions formed within the first and second connection holes, and third and fourth conductive portions respectively formed on the first and second plug portions. A space between the first and second connection holes located in the interlayer insulator film is made smaller than that between the first and second connection holes on a surface of the interlayer insulator film.

According to the present invention, a space between the first and second plug portions formed in the interlayer insulator film can be made smaller because the space between the first and second connection holes located in the interlayer insulator film is made smaller than the space between the first and second connection holes on the surface of the interlayer insulator film. With this, a capacity between desired first and second plug portions within a memory cell can increase, and as a result, a capacity can be added to a storage node. Therefore, resistance to the soft error can be enhanced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described referring to FIGS. 1–31. In the following, an example wherein the present invention is applied to the SRAM (static type semiconductor memory device) is described.

Figure 30:
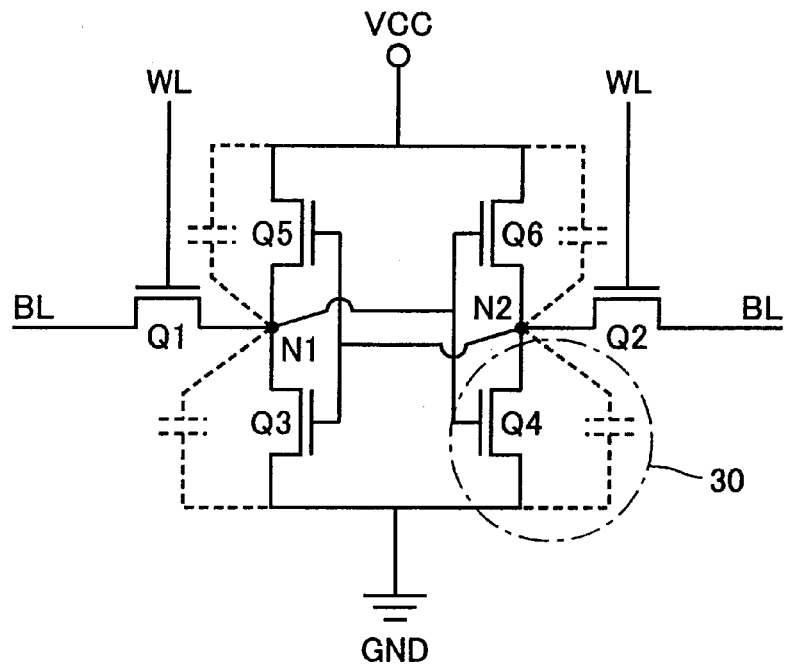
FIG. 30 is an equivalent circuit diagram of a memory cell of the SRAM according to one embodiment of the present invention.

FIG. 30 is an equivalent circuit diagram of a memory cell of the SRAM according to an embodiment of the present invention. The SRAM includes a memory cell array region in which memory cells are formed and a peripheral circuit region in which a peripheral circuit controlling operations of the memory cells is formed.

As shown in FIG. 30, a memory cell has first and second inverters and two access MOS transistors Q1, Q2. The first inverter includes a first driver MOS transistor Q3 and a first load MOS transistor Q5, and the second inverter includes a second driver MOS transistor Q4 and a second load MOS transistor Q6.

Inputs and outputs of the first and second inverters are connected to each other to form a flip-flop. A source of first access MOS transistor Q1 is connected to a first storage node N1 of the flip-flop, and a source of second access MOS transistor Q2 is connected to a second storage node N2 of the flip-flop.

Each of the gates of first and second access MOS transistors Q1, Q2 is connected to a word line WL, and each of the sources of first and second access MOS transistors Q1, Q2 is connected to a bit line BL. Sources of first and second load MOS transistors Q5, Q6 are connected to a power supply (VCC).

Figure 31:
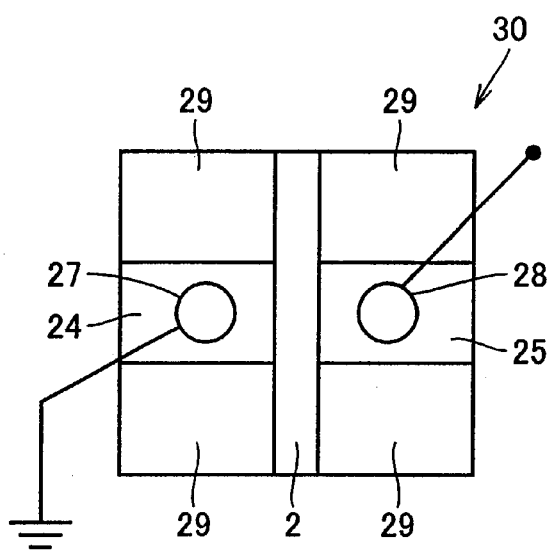
FIG. 31 is a partial enlarged plan view of the memory cell of the SRAM according to one embodiment of the present invention.

FIG. 31 is an enlarged plan view of a region 30 shown in FIG. 30, that is, a layout of second driver MOS transistor Q4.

As shown in FIG. 31, second driver MOS transistor Q4 has a gate electrode 2, a source 24 and a drain 25. Source 24 is grounded via a contact portion 27, and drain 25 is connected to second storage node N2 via a contact portion 28. Source 24 and drain 25 are surrounded with an element isolation region 29. Each of the other MOS transistors within the memory cell also has a gate electrode, a source and a drain.

As shown by dotted lines in FIG. 30, in this embodiment, a capacity is added to at least one of the following sites: a site between power source (VCC) and first storage node N1, a site between power source (VCC) and second storage node N2, a site between a ground wire (GND) and first storage node N1, and a site between ground wire (GND) and second storage node N2.

In order to form a capacity on the above-mentioned site, a capacity is added, for example, between the source and drain of the load MOS transistor and/or the driver MOS transistor. More specifically, spaces between connection holes (contact holes) on the sources and drains of first and second load MOS transistors Q5, Q6 are respectively reduced, or spaces between connection holes on the sources and drains of first and second driver MOS transistors Q3, Q4 are respectively reduced.

Figure 29:
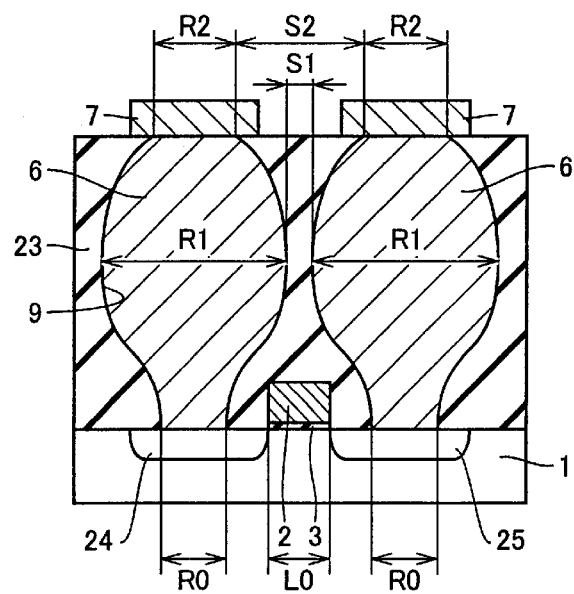
FIG. 29 is a partial cross-sectional view of an exemplary structure of a representative memory cell of the SRAM in an embodiment of the present invention.

FIG. 29 shows exemplary structures of the source and drain and their peripheral regions of the MOS transistor in which the present invention is applied. In the example shown in FIG. 29, structures of connections between source (impurity region) 24 and drain (impurity region) 25 and an upper-layer interconnection of the MOS transistor are shown.

As shown in FIG. 29, source 24 and drain 25, which are conductive portions, are formed spaced apart with each other in a main surface of a semiconductor substrate 1. Gate electrode 2 is formed on the main surface of semiconductor substrate 1 via an insulator film 3. An interlayer insulator film 23 is formed so as to cover gate electrode 2. Interlayer insulator film 23 may be formed with one insulator film, or may be formed by stacking a plurality of insulator films.

A set of contact holes 9 are formed in interlayer insulator film 23 as connection holes reaching source 24 and drain 25. A plug portion 6 made of a conductive material is formed within contact hole 9, and a metal interconnection 7, which is a conductive portion, is formed on plug portion 6.

As shown in FIG. 29, contact hole 9 has a shape that is expanding in a lateral direction (a direction parallel to the main surface of the semiconductor substrate) in interlayer insulator film 23. Therefore, a space (minimum space) S1 between contact holes 9 located in interlayer insulator film 23 can be made smaller than a space (minimum space) S2 between contact holes 9 on the surface of interlayer insulator film 23. In the example shown in FIG. 29, space S1 is smaller than a width (a width in a direction of gate length) L0 of gate electrode 2.

By making space S1 smaller as described above, a space between plug portions 6 can be made smaller. As a capacity between plug portions 6 is inversely proportional to space S1 between contact holes 9, that is, the space between plug portions 6, the capacity between plug portions 6 can increase by making space S1 smaller as described above. With this, the capacity between the source and drain of the MOS transistor can increase.

When this idea is applied to first and second driver MOS transistors Q3, Q4 or to first and second load MOS transistors Q5, Q6, each capacity between the source and drain of these MOS transistors can increase. With this, the state can be equivalent to that when a capacity is added on the site shown by the dotted lines in FIG. 30. As a result, a ratio of a change in charge to storage nodes N1, N2 by the α ray can be decreased, and thus the soft error can be reduced.

In addition, as space S1 can be made smaller while maintaining space S2 between contact holes 9, resistance to the soft error can be enhanced with reducing the size by further decreasing space S2.

As shown in FIG. 29, a width (maximum width) R1 of contact hole 9 located in interlayer insulator film 23 is larger than a width R0 of the bottom (an end facing semiconductor substrate 1) portion of contact hole 9 or a width R2 of the upper end (surface of interlayer insulator film 23) portion of contact hole 9.

With contact hole 9 having such a shape, space S1 can be made smaller while maintaining space S2, and the capacity between plug portions 6 can increase as described above.

The idea of the present invention can be applied to a set of contact holes connecting conductive potions. Thus, the idea of the present invention can also be applied to contact holes connecting interconnections, in addition to the connection holes as described above connecting impurity regions (conductive portions) formed in a semiconductor substrate and an interconnection.

First Embodiment

Figure 1:
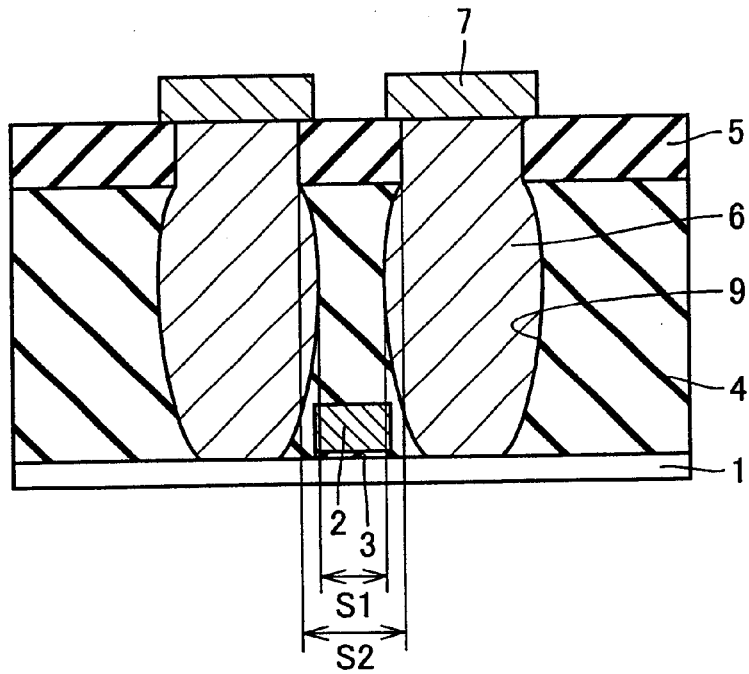
FIG. 1 is a partial cross-sectional view of a memory cell of a SRAM according to a first embodiment of the present invention.

A specific exemplary structure according to a first embodiment of the present invention will be described referring to FIGS. 1–4. FIG. 1 is a partial cross-sectional view of a memory cell of the SRAM according to the first embodiment of the present invention, showing an example of a cross-sectional structure of an MOS transistor portion.

As shown in FIG. 1, the MOS transistor is formed on a main surface of semiconductor substrate 1 such as a silicon substrate. The MOS transistor may be a driver MOS transistor or a load MOS transistor. Gate electrode 2 is formed on the main surface of semiconductor substrate 1 via insulator film 3 such as a silicon oxide film. Gate electrode 2 is formed, for example, with a polysilicon film doped with an impurity.

An interlayer insulator film 4 is formed so as to cover gate electrode 2, and an interlayer insulator film 5 is formed on interlayer insulator film 4. Interlayer insulator film 4 is formed with a material having an etching rate (typically an etching rate of isotropic etching) higher than that of interlayer insulator film 5. When interlayer insulator film 4 is formed with BPTEOS (Boro Phospho Tetra Etyle Ortho Silicate), for example, interlayer insulator film 5 may be formed with TEOS (Tetra Etyle Ortho Silicate).

A set of contact holes 9 are formed so as to penetrate interlayer insulator films 4, 5 and reach the source and drain formed in the main surface of semiconductor substrate 1. Contact hole 9 has a shape expanding in the lateral direction in interlayer insulator film 4. In the example shown in FIG. 1, contact hole 9 has substantially a barrel-shape. With this, space S1 between contact holes 9 located in interlayer insulator film 4 can be made smaller than space S2 between contact holes 9 on the surface of interlayer insulator film 5.

Plug portion 6 formed with metal such as tungsten is formed within contact hole 9. Thus, a space between plug portions 6 in interlayer insulator film 4 also becomes as small as S1, and the capacity between plug portions 6 can increase.

It is preferable that interlayer insulator film 4 has a thickness larger than that of interlayer insulator film 5. With this, the portion having small space S1 can be longer in a vertical direction. This can also contribute to the increased capacity between plug portions 6.

Metal interconnection 7 made of Al alloy or the like is formed so as to extend from a portion above plug portion 6 to a portion above interlayer insulator film 5.

Figure 3:
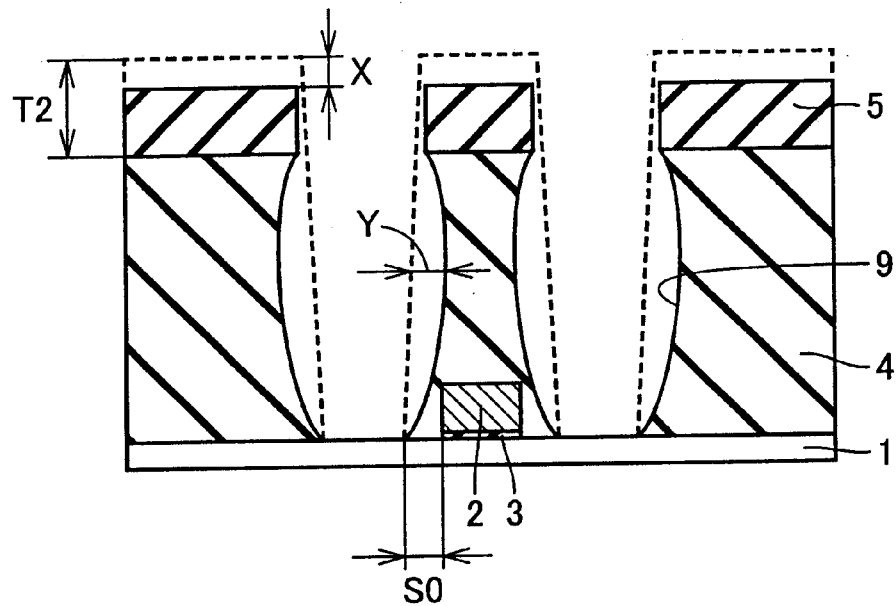
Figure 4:
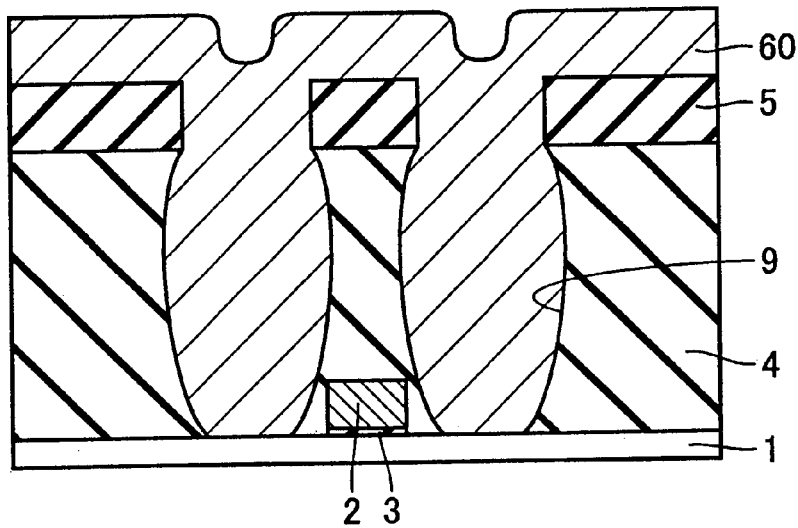

A manufacturing method of the MOS transistor and peripheral portions within the memory cell of the SRAM shown in FIG. 1 will be described with reference to FIGS. 2–4.

Figure 2:
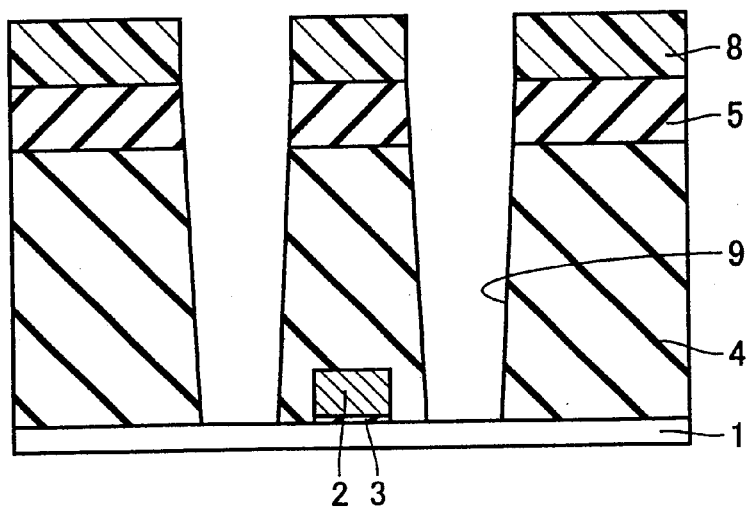
FIGS. 2–4 are respective cross-sectional views of first to third steps in a manufacturing process of the memory cell of the SRAM shown in FIG. 1.

As shown in FIG. 2, gate electrode 2 is formed on the main surface of semiconductor substrate 1 via insulator film 3. The main surface of semiconductor substrate 1 is then doped with a prescribed impurity using an ion implantation method or the like, and the impurity is diffused to form a source and a drain (impurity regions) on either side of gate electrode 2.

Interlayer insulator film 4 is then formed so as to cover gate electrode 2 using a CVD (Chemical Vapor Deposition) method or the like. After planarization of a surface of interlayer insulator film 4, interlayer insulator film 5 is formed so as to cover interlayer insulator film 4 using the CVD method or the like.

Resist is applied over interlayer insulator film 5, and the resist is processed to have a desired patterned form by a photomechanical technique to provide a resist pattern 8 for forming a contact hole. As shown in FIG. 2, contact hole 9 is formed by anisotropic etching using resist pattern 8 as a mask.

Resist pattern 8 is then removed, and isotropic etching is performed. Dry etching or wet etching using hydrofluoric acid or ammonia-peroxide mixture (APM), for example, can be adopted. By the isotropic etching, interlayer insulator film 4 having a higher etching rate is etched more than interlayer insulator film 5, which results in formation of contact hole 9 having a barrel-shape, as shown in FIG. 3.

Herein, a thickness T2 of interlayer insulator film 5 is set to be larger than an etched amount X of interlayer insulator film 5 during the isotropic etching. With this, interlayer insulator film 5 having a lower etching rate can be left, and thus the width of contact hole 9 in interlayer insulator film 4 can be made larger than the width of the upper end of contact hole 9.

In addition, a space S0 between contact hole 9 and gate electrode 2 before the isotropic etching is set to be larger than an etched amount Y of interlayer insulator film 4 during the isotropic etching. With this, contact hole 9 can be prevented from reaching gate electrode 2.

Thereafter, a metal film 60 is deposited on the whole surface using a film-formation method having a good coverage such as the CVD method or a reflow sputtering method in which heat processing is performed after sputtering. With this, contact hole 9 is filled with metal film 60, as shown in FIG. 4.

Thereafter, the surface of interlayer insulator film 5 is exposed using an etch back method or a CMP (Chemical Mechanical Polishing) method, and plug portion 6 is formed as shown in FIG. 1. Metal interconnection 7 is then formed on plug portion 6. With the steps described above, the structure shown in FIG. 1 is obtained.

Second Embodiment

A second embodiment of the present invention and a variation thereof are described with reference to FIGS. 5–11. Though an example of formation of an interlayer insulator film having a two-layer structure is described in the first embodiment, the interlayer insulator film may be formed to have a three-layer structure.

In this example, it is preferable that an interlayer insulator film located in the middle (a second interlayer insulator film) is formed with a material having an etching rate higher than that of interlayer insulator films located above and below (first and third interlayer insulator films). With this, as the second interlayer insulator film can be etched more than the first and third interlayer insulator films when contact holes are formed in the interlayer insulator film, a space between the contact holes can be made smaller in the second interlayer insulator film.

In addition, as the first interlayer insulator film covering a lower-layer interconnection is formed with a material having an etching rate lower than that of the second interlayer insulator film, a short-circuit between the lower-layer interconnection and the contact hole can be avoided while the etched amount of the second interlayer insulator film is increased during the formation of the contact hole. Therefore, the space between the contact holes can further be smaller. It is possible, for example, to make the space between the contact holes smaller than the width of the lower-layer interconnection. With this, the capacity between the plug portions can further increase.

Herein, the second interlayer insulator film preferably has a thickness larger than that of the first and third interlayer insulator films. This can also contribute to the increased capacity between the plug portions.

Figure 5:
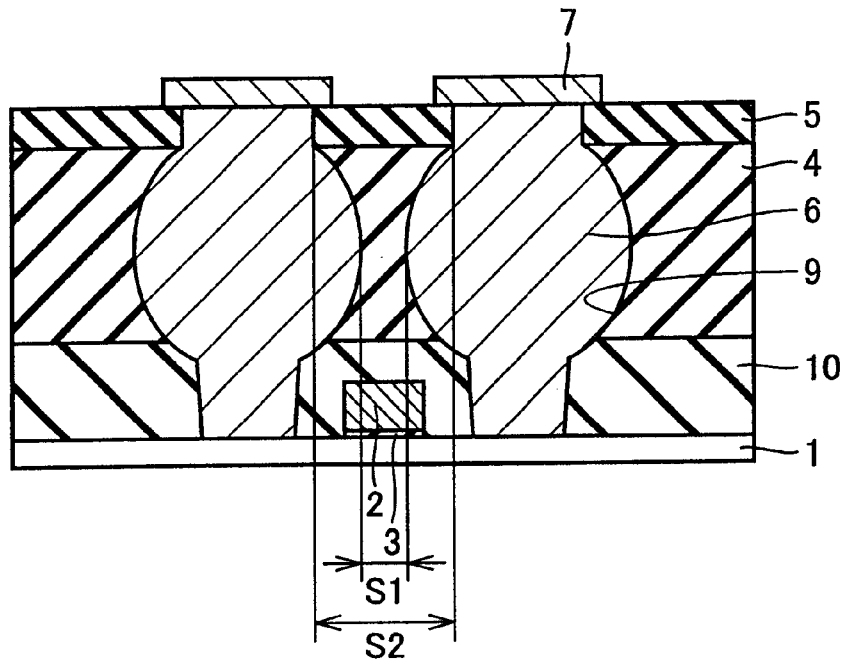
FIG. 5 is a partial cross-sectional view of a memory cell of the SRAM according to a second embodiment of the present invention.

In the example shown in FIG. 5, three interlayer insulator films 10, 4, 5 are stacked, and interlayer insulator film 4 located in the middle has an etching rate higher than that of interlayer insulator films 5, 10. TEOS, for example, can be used as interlayer insulator films 5, 10, and BPTEOS, for example, can be used as interlayer insulator film 4. It is preferable that interlayer insulator film 4 has a thickness larger than that of interlayer insulator films 5, 10.

As the etching rate of interlayer insulator film 10 covering gate electrode 2 as the lower-layer interconnection is lower than that of interlayer insulator film 4, contact hole 9 has a shape widely expanding in the lateral direction at a center portion of a vertical direction. Therefore, space S1 between contact holes 9 can be made smaller than that in the first embodiment, while ensuring insulation between contact hole 9 and gate electrode 2.

Structures other than that described above are similar to those in the first embodiment.

A manufacturing method of the MOS transistor and peripheral portions within the memory cell of the SRAM shown in FIG. 5 will be described with reference to FIGS. 6–8.

Figure 6:
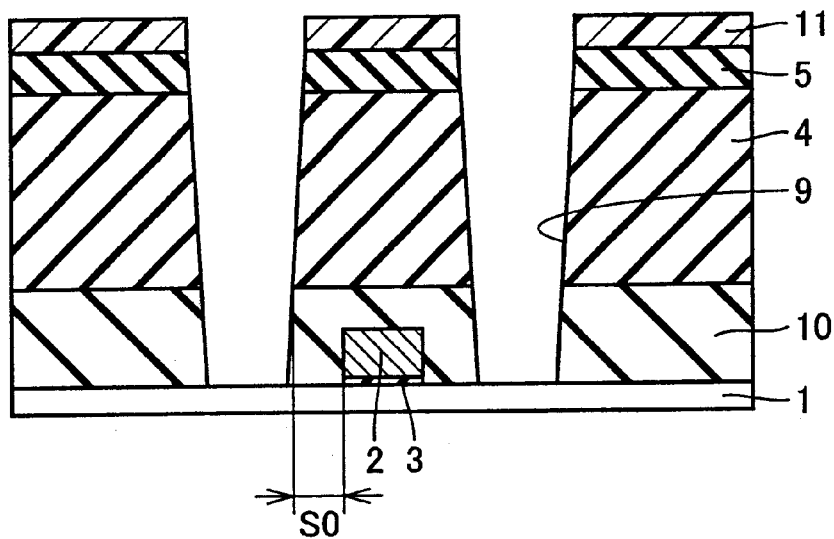
FIGS. 6–8 are respective cross-sectional views of first to third steps in a manufacturing process of the memory cell of the SRAM shown in FIG. 5.

As shown in FIG. 6, insulator film 3, gate electrode 2, and the source and drain (impurity regions) are formed with steps similar to those in the first embodiment. Interlayer insulator film 10 is then formed so as to cover gate electrode 2 by the CVD method or the like. After planarization of a surface of interlayer insulator film 10, interlayer insulator films 4, 5 are successively formed by a procedure similar to that in the first embodiment.

A resist pattern 11 is formed on interlayer insulator film 5 by a procedure similar to that in the first embodiment, and anisotropic etching is successively performed to interlayer insulator films 5, 4 and 10 using resist pattern 11 as a mask. With this step, contact hole 9 is formed as shown in FIG. 6.

Isotropic etching is then performed as in the first embodiment, and contact hole 9 is formed into substantially a barrel-shape. In this step, as etching rates of interlayer insulator films 5, 10 are lower than that of interlayer insulator film 4, interlayer insulator film 4 are largely etched to obtain contact hole 9 having a shape extremely expanding in the lateral direction at a center portion of a vertical direction. Resist pattern 11 is then removed. When the thickness of interlayer insulator film 5 is made larger than the etched amount of interlayer insulator film 5 during the isotropic etching, the isotropic etching may be performed after resist pattern 11 is removed.

Figure 8:
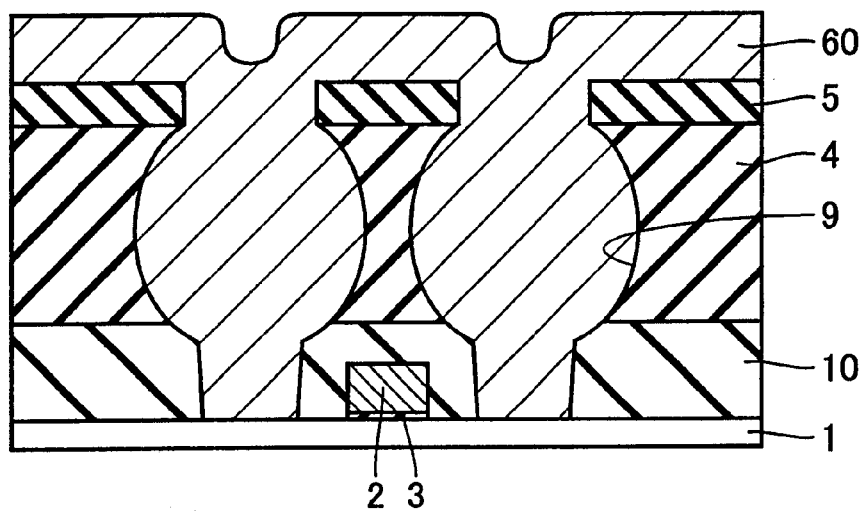

Thereafter, with a procedure similar to that in the first embodiment, metal film 60 is formed as shown in FIG. 8, plug portion 6 is formed by the etch back or CMP method, and metal interconnection 7 is formed to obtain the structure shown in FIG. 5.

A variation of the second embodiment will now be described referring to FIGS. 9–11. In this variation, a protection insulator film is formed on an inner surface of the contact hole, and the plug portion is formed on the protection insulator film. With this, a connection between contact holes by a pinhole can be suppressed.

The protection insulator film is preferably formed with a material having a permittivity higher than that of the interlayer insulator films. In this example, the capacity between the plug portions can further increase because the insulator film having a high permittivity can be formed between the plug portions.

Figure 9:
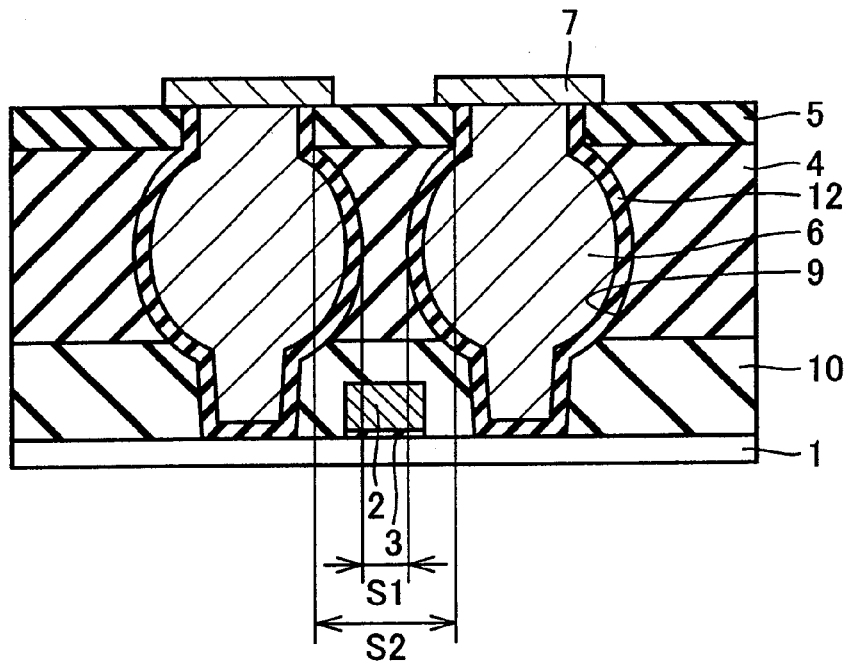
FIG. 9 is a partial cross-sectional view of a memory cell of the SRAM according to a variation of the second embodiment.

As shown in FIG. 9, in this variation, a dielectric film 12 is formed on an inner surface of contact hole 9. Herein, dielectric film 12 is a film formed with a material having a permittivity higher than that of interlayer insulator film 4 located between contact holes 9. When interlayer insulator film 4 is formed with BPTEOS, for example, dielectric film 12 may be formed with a silicon nitride film. Other structures are similar to those in the example shown in FIG. 5.

A manufacturing method of the variation will now be described referring to FIGS. 10 and 11.

Figure 7:
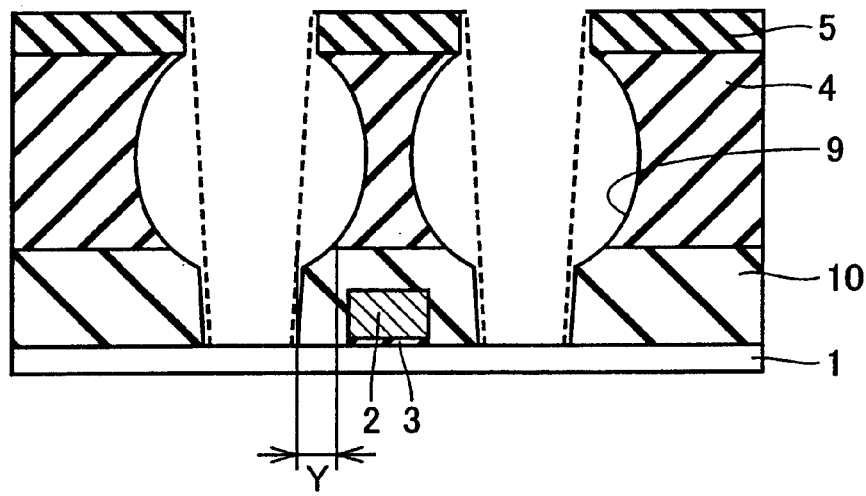
Figure 10:
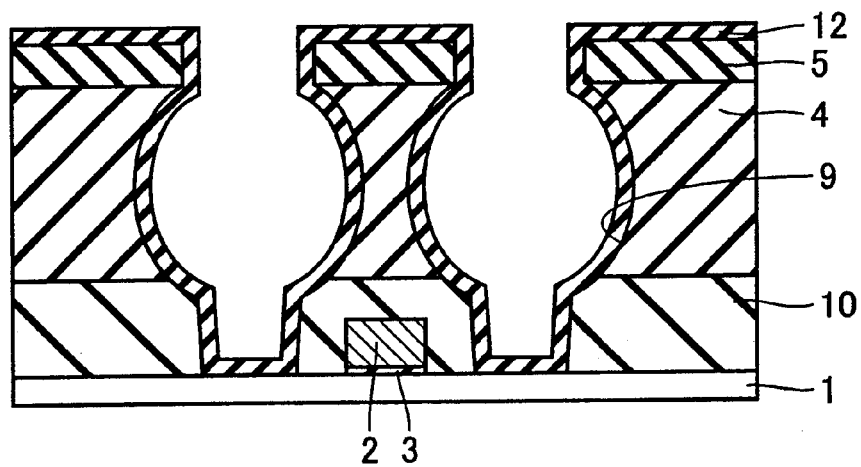
FIGS. 10 and 11 are respective cross-sectional views of first and second steps in a manufacturing process of the memory cell of the SRAM shown in FIG. 9.
Figure 11:
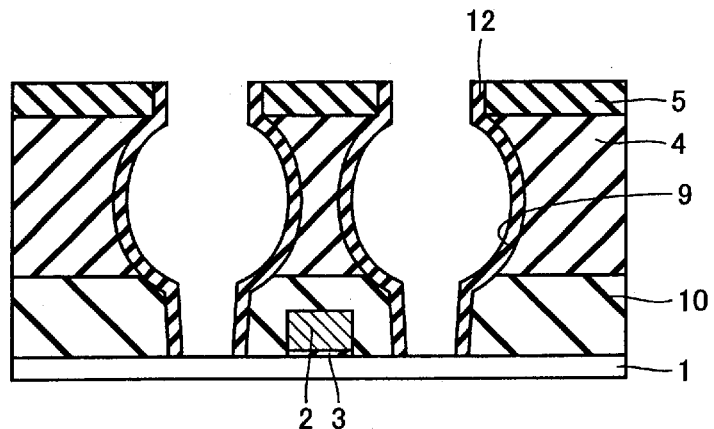

After the structure shown in FIG. 7 is obtained with steps similar to those in the above-described example, dielectric film 12 is formed as shown in FIG. 10 using the CVD method or the like. Anisotropic etching is then performed to dielectric film 12 to expose a main surface portion of semiconductor substrate 1 located on the bottom of contact hole 9 and a surface of interlayer insulator film 5, as shown in FIG. 11. Thereafter, plug portion 6 and metal interconnection 7 are formed with steps similar to those in the above-described example, and the structure shown in FIG. 9 is obtained.

Third Embodiment

A third embodiment of the present invention will be described referring to FIGS. 12–16. In the second embodiment described above, the interlayer insulator film has a three-layer structure of insulator films. Herein, a difference in etching rates of interlayer insulator films of the lowest layer (first interlayer insulator film) and the middle layer (second interlayer insulator film) may be made larger to increase an etching selective ratio of the first and second interlayer insulator films.

In this example, an etching step can be stopped at the first interlayer insulator film, and a contact portion can be formed to have a so-called SAC (Self Alignment Contact) structure. With this, the space between the contact holes can further be made smaller.

More specifically, the space between the contact holes can be made smaller than the width of the lower-layer interconnection. Therefore, the capacity between the plug portions can increase regardless of the width of the lower-layer interconnection. In addition, the portion having a small spacing between the contact holes can become longer in a vertical direction. This will be significant when the thickness of the second interlayer insulator film is larger than that of the first and third interlayer insulator films. Herein, it is preferable that the etching rate of the first interlayer insulator film is lower than that of the third interlayer insulator film.

Figure 12:
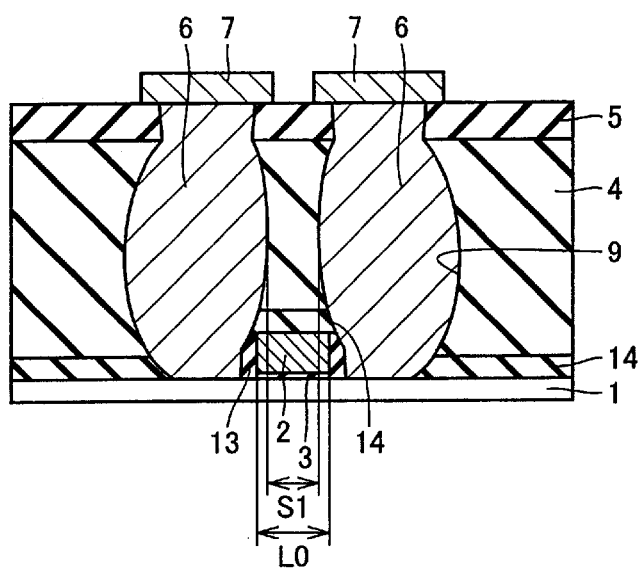
FIG. 12 is a partial cross-sectional view of a memory cell of the SRAM according to a third embodiment of the present invention.

In the example shown in FIG. 12, silicon nitride films 13, 14 are formed so as to cover the sidewall and top surface of gate electrode 2, and interlayer insulator films 4, 5 are formed on silicon nitride films 13, 14. Respective one sidewalls of contact holes 9 come closer to each other, and reach silicon nitride films 13, 14 so as to overlap with side end portions of gate electrode 2. With this, space S1 between contact holes 9 can further become smaller. Other structures are similar to those in the second embodiment.

A manufacturing method of the MOS transistor and peripheral portions within the memory cell of the SRAM shown in FIG. 12 will be described with reference to FIGS. 13–16.

Figure 13:
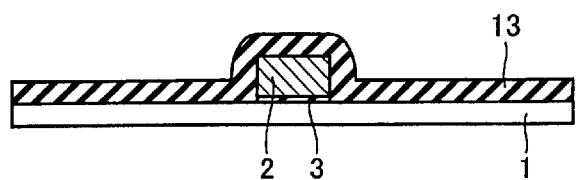
FIGS. 13–16 are respective cross-sectional views of first to fourth steps in a manufacturing process of the memory cell of the SRAM shown in FIG. 12.

As shown in FIG. 13, insulator film 3, gate electrode 2, and the source and drain (impurity regions) are formed with steps similar to those in the first embodiment. Silicon nitride film 13 is then formed so as to cover gate electrode 2 by the CVD method or the like. Anisotropic etching is performed to silicon nitride film 13 to leave silicon nitride film 13 of a sidewall-shape on the sidewall of gate electrode 2, as shown in FIG. 14.

Figure 14:
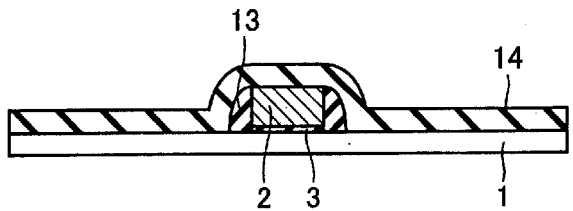

Silicon nitride film 14 is then formed by the CVD method or the like, as shown in FIG. 14. Interlayer insulator film 4 having a relatively high etching rate is formed on silicon nitride film 14 by a procedure similar to that in the first embodiment and is planarized, and interlayer insulator film 5 having an etching rate lower than interlayer insulator film 4 is formed.

Figure 15:
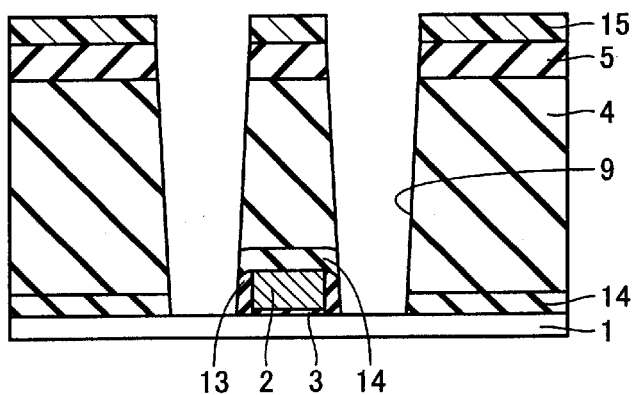

A resist pattern 15 is formed on interlayer insulator film 5 by a procedure similar to that in the first embodiment, and anisotropic etching is performed to form contact hole 9, as shown in FIG. 15. Herein, the anisotropic etching may be performed by two or more steps with different conditions for respective interlayer insulator films to selectively etch different kinds of insulator films.

Figure 16:
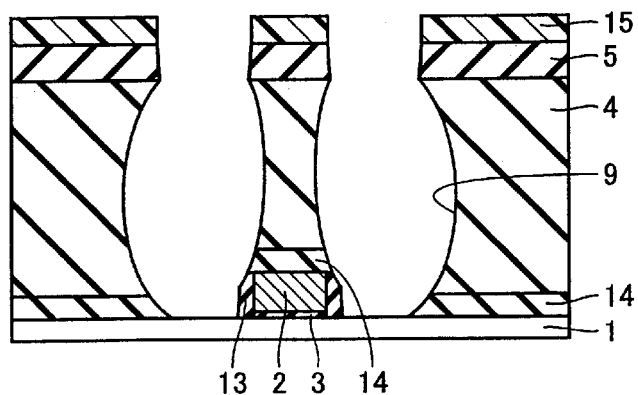

Thereafter, isotropic etching is performed as in the first embodiment to form contact hole 9 into a barrel-shape, as shown in FIG. 16. A short-circuit between gate electrode 2 and contact hole 9 can be avoided by setting the thicknesses of silicon nitride films 13, 14 located between contact hole 9 and gate electrode 2 in FIG. 15 to be larger than the amounts of isotropic etching of silicon nitride films 13, 14.

In addition, it is preferable to perform the isotropic etching with leaving resist pattern 15, as shown in FIG. 16. With this, a decrease in amount of interlayer insulator film 5 during the isotropic etching can be suppressed, and uniformity of the surface of interlayer insulator film 5 is enhanced.

Thereafter, plug portion 6 and metal interconnection 7 are formed with a procedure similar to that in the first embodiment, and the structure shown in FIG. 12 is obtained.

Fourth Embodiment

A fourth embodiment of the present invention will be described with reference to FIGS. 17–20. Though the space between the contact holes is made smaller by etching in the above-described first to third embodiments, the space is made smaller by heat processing in the fourth embodiment.

When the interlayer insulator film includes a first interlayer insulator film covering a lower-layer interconnection and a second interlayer insulator film covering the first interlayer insulator film, for example, the first interlayer insulator film is formed with a material having a heat shrinkage ratio higher than that of the second interlayer insulator film.

In this example, the first interlayer insulator film can shrink more than the second interlayer insulator film by heat processing after the contact hole formation, and thus the contact hole can become wider in the first interlayer insulator film. Therefore, the contact holes can be closer to each other, and the space between the contact holes can become smaller.

In addition to the condition of the heat shrinkage ratio described above, it is also possible to select as the first interlayer insulator film a material having an etching rate higher than that of the second interlayer insulator film, and to perform isotropic etching in combination with the above-described heat processing. In this example, the contact hole can further become wider, and the space between the contact holes can be smaller.

Figure 17:
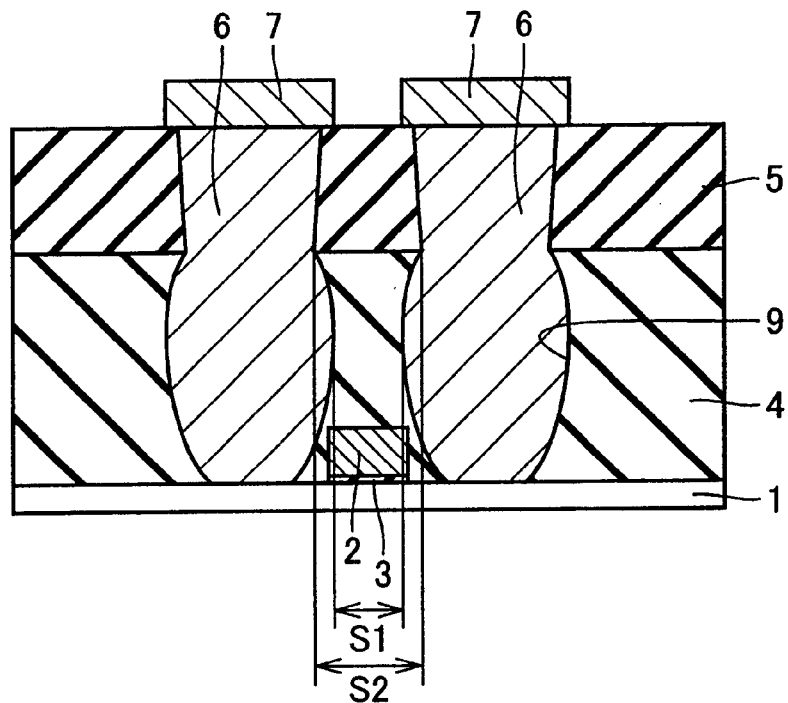
FIG. 17 is a partial cross-sectional view of a memory cell of the SRAM according to a fourth embodiment of the present invention.

In the example shown in FIG. 17, a material having a relatively high heat shrinkage ratio is used as interlayer insulator film 4 of the lower layer, and a material having a relatively low heat shrinkage ratio is used as interlayer insulator film 5 of the upper layer. More specifically, P-TEOS, BPTEOS or BPSG (Boro Phospho Silicate Glass) can be adopted as interlayer insulator film 4, while TEOS or NSG (Non-doped Silicate Glass) can be adopted as interlayer insulator film 5.

In addition, relative thickness of interlayer insulator film 5 to interlayer insulator film 4 is made larger than that in the first embodiment. By forming relatively thick interlayer insulator film 5 as such, unnecessary excess widening of an upper-end opening of contact hole 9 due to the heat shrinkage of interlayer insulator films 4, 5 can be suppressed. Other structures are similar to those in the first embodiment.

A manufacturing method of the MOS transistor and peripheral portions within the memory cell of the SRAM shown in FIG. 17 will be described with reference to FIGS. 18–20.

Figure 18:
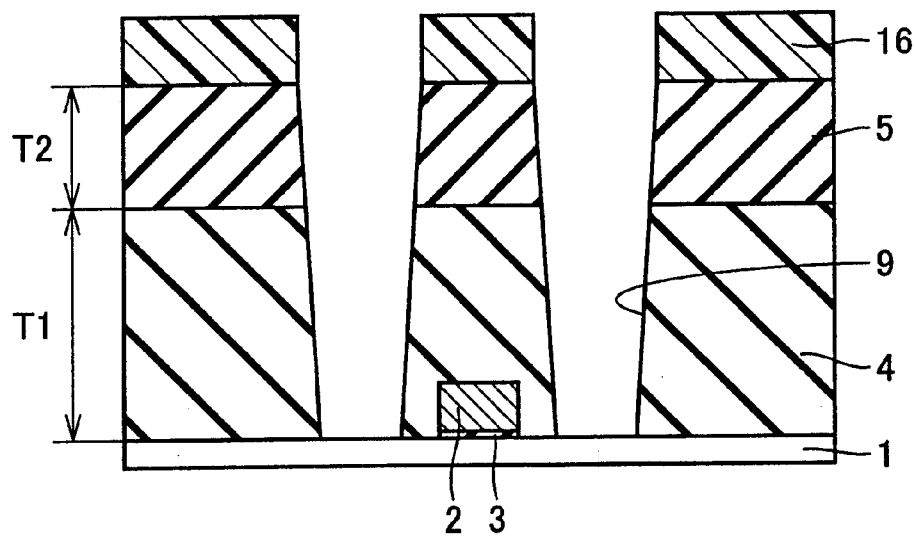
FIGS. 18–20 are respective cross-sectional views of first to third steps in a manufacturing process of the memory cell of the SRAM shown in FIG. 17.

As shown in FIG. 18, insulator film 3, gate electrode 2, and the source and drain (impurity regions) are formed with steps similar to those in the first embodiment. Interlayer insulator films 4 and 5 are then formed using the CVD method or the like. In this step, a surface of interlayer insulator film 4 is planarized, and a thickness T1 of interlayer insulator film 4 is made larger than a thickness T2 of interlayer insulator film 5.

Thereafter, a resist pattern 16 is formed on interlayer insulator film 5 by a procedure similar to that in the first embodiment, and anisotropic etching is performed using resist pattern 16 as a mask to form contact hole 9, as shown in FIG. 18.

Heat processing is then performed. The heat processing is performed, for example, at 700° C. or higher temperature using RTA (Rapid Thermal Annealing) or a thermal diffusion furnace. With this step, interlayer insulator films 4 and 5 can shrink with heat.

Figure 19:
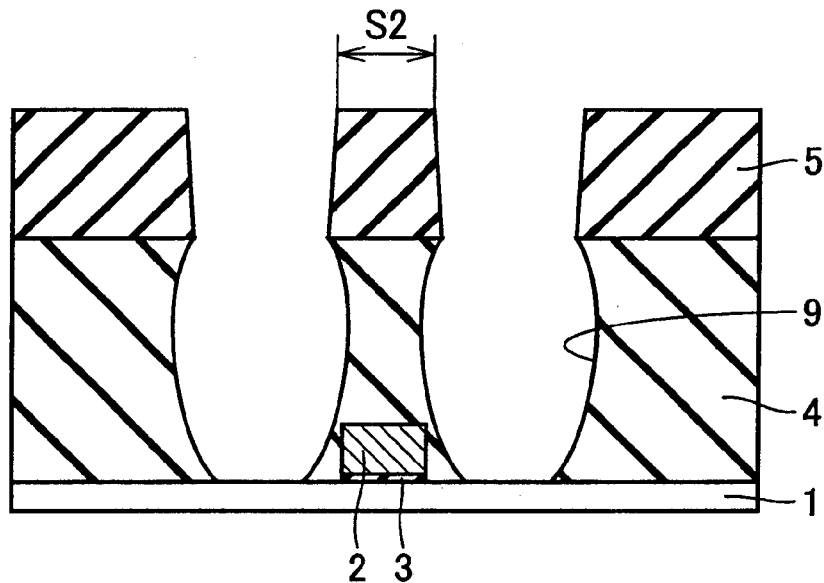

As the heat shrinkage ratio of interlayer insulator film 4 is larger than that of interlayer insulator film 5, the amount of heat shrinkage of interlayer insulator film 4 is larger, and contact hole 9 can be expanded in the lateral direction in interlayer insulator film 4, as shown in FIG. 19. On the other hand, unnecessary excess widening of the upper-end opening of contact hole 9 can be suppressed by ensuring a certain amount of thickness of interlayer insulator film 5. Therefore, while contact hole 9 is formed into a barrel-shape, space S2 can be set to a proper value.

It is also possible to select as interlayer insulator film 4 a material having an etching rate higher than that of interlayer insulator film 5, and to perform isotropic etching after the heat processing to further expand contact hole 9 in the lateral direction in interlayer insulator film 4.

Figure 20:
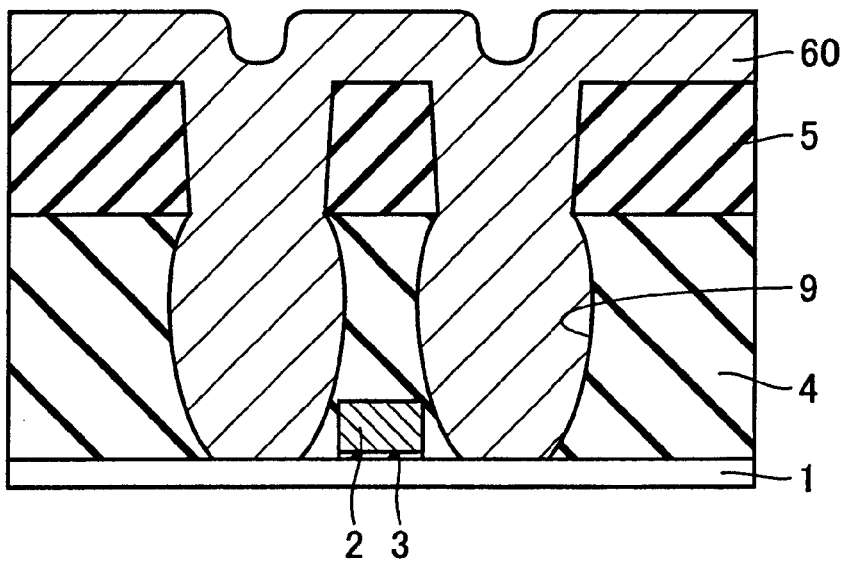

Thereafter, as shown in FIG. 20, metal film 60 is deposited on the whole surface by a procedure similar to that in the first embodiment to form metal film 60 within contact hole 9, plug portion 6 is formed by the etch back or CMP method, and metal interconnection 7 is formed on plug portion 6. With the above-described steps, the structure shown in FIG. 17 is obtained.

Fifth Embodiment

A fifth embodiment of the present invention will be described with reference to FIGS. 21–23. In the fifth embodiment, a protection insulator film (a dielectric film) is formed on an inner surface of the contact hole, and the plug portion is formed on the protection insulator film. By forming the protection insulator film on the inner surface of the contact hole as such, a connection between the contact holes due to generation of a pinhole between the contact holes can be suppressed. Therefore, reliability of the device can be enhanced. In addition, the capacity between the plug portions can increase by setting the permittivity of the protection insulator film to be larger than that of the interlayer insulator film.

Figure 21:
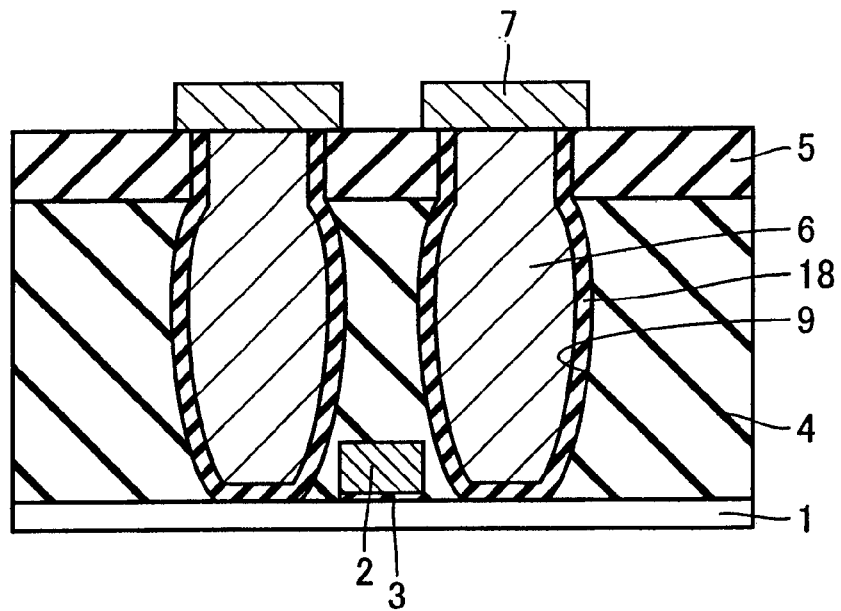
FIG. 21 is a partial cross-sectional view of a memory cell of the SRAM according to a fifth embodiment of the present invention.

In the example shown in FIG. 21, a dielectric film 18 having a permittivity higher than that of interlayer insulator film 4 is formed on an inner surface of contact hole 9. An example of dielectric film 18 includes a silicon nitride film. Plug portion 6 is formed on dielectric film 18. Other structures are similar to those in the first embodiment.

By forming dielectric film 18 on the inner surface of contact hole 9 as described above, a connection between contact holes 9 due to a pinhole can be suppressed, and the capacity between plug portions 6 can increase.

A manufacturing method of the MOS transistor and peripheral portions within the memory cell of the SRAM shown in FIG. 21 will be described with reference to FIGS. 22 and 23.

Figure 22:
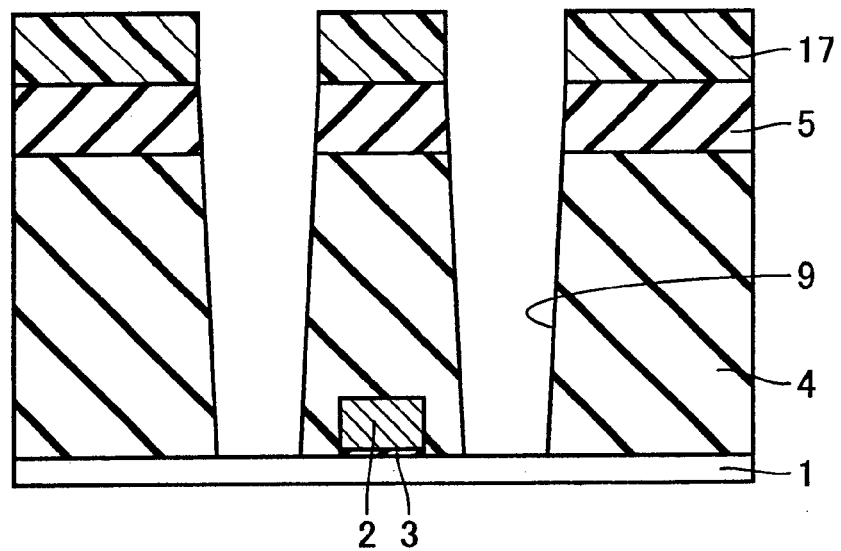
FIGS. 22 and 23 are respective cross-sectional views of first and second steps in a manufacturing process of the memory cell of the SRAM shown in FIG. 21.

As shown in FIG. 22, insulator film 3, gate electrode 2, the source and drain (impurity regions), interlayer insulator films 4, 5, and a resist pattern 17 are formed with steps similar to those in the first embodiment. Contact hole 9 is then formed by anisotropic etching using resist pattern 17 as a mask by a procedure similar to that in the first embodiment, and isotropic etching is performed to contact hole 9. With this step, contact hole 9 is formed into a barrel-shape, as shown in FIG. 23.

Figure 23:
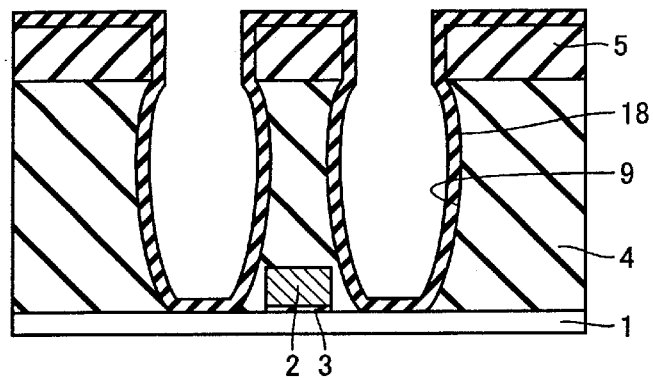

As shown in FIG. 23, dielectric film 18 such as a silicon nitride film is formed so as to cover the inner surface of contact hole 9 by the CVD method or the like. Thereafter, anisotropic etching is performed to dielectric film 18 to expose a portion of semiconductor substrate 1 on the bottom of contact hole 9.

Plug portion 6 and metal interconnection 7 are then formed with steps similar to those in the first embodiment. With these steps, the structure shown in FIG. 21 is obtained.

Sixth Embodiment

A sixth embodiment of the present invention will be described with reference to FIGS. 24–28. In each embodiment described above, an example is described in which the metal interconnection as an upper-layer interconnection is formed so as to extend from a portion above the contact hole to a portion above the interlayer insulator film. The metal interconnection, however, may be embedded in the interlayer insulator film. A trench is formed in a surface of the interlayer insulator film so as to reach the contact hole, for example, and the metal interconnection is embedded in the trench.

In the sixth embodiment, a so-called damascene interconnection is adopted to embed the metal interconnection in the interlayer insulator film, and the present invention is applied to a trench for the damascene interconnection. That is, the trench for the damascene interconnection is expanded in the lateral direction. With this, not only the capacity between the plug portions but also the capacity between the metal interconnections can increase.

Only the trench for the damascene interconnection may be expanded in the lateral direction. When the present invention is applied to a set of connection holes connecting interconnections, the set of connection holes are expanded in the lateral direction, and the space between the connection holes are made smaller.

Figure 24:
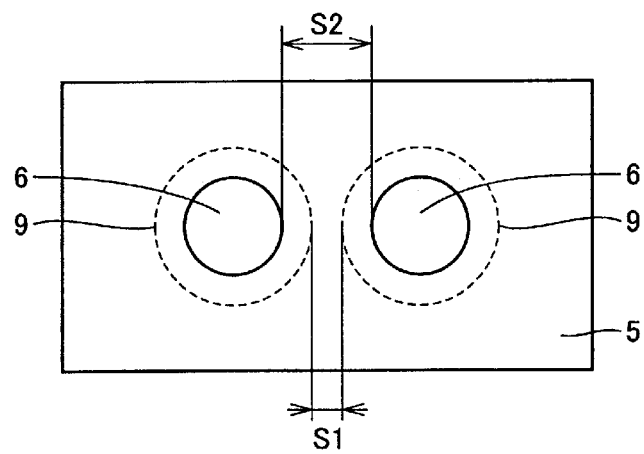
FIG. 24 is a plan view of exemplary structures of a plug portion and a contact hole in the first embodiment of the present invention.

FIG. 24 is a plan view of contact hole 9 and plug portion 6 in the first embodiment described above. Metal interconnection 12 extends from a portion above plug portion 6 to a portion above interlayer insulator film 5.

Figure 25:
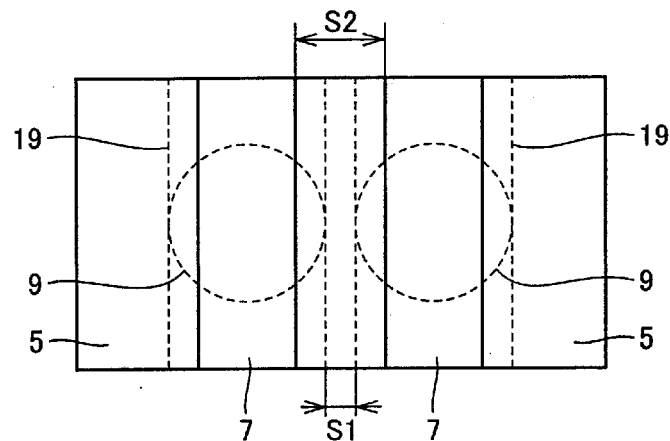
FIG. 25 is a partial plan view of a memory cell of the SRAM according to a sixth embodiment of the present invention.

In the sixth embodiment, on the other hand, a trench 19 opening in a surface of interlayer insulator film 5 is formed, and metal interconnection 7 is embedded in trench 19, as shown in FIG. 25 as an example. Contact hole 9 is formed in a lower portion of trench 19, and contact hole 9 is connected with trench 19. Therefore, plug portion 6 within contact hole 9 and metal interconnection 7 within trench 19 are electrically connected to each other.

Figure 26:
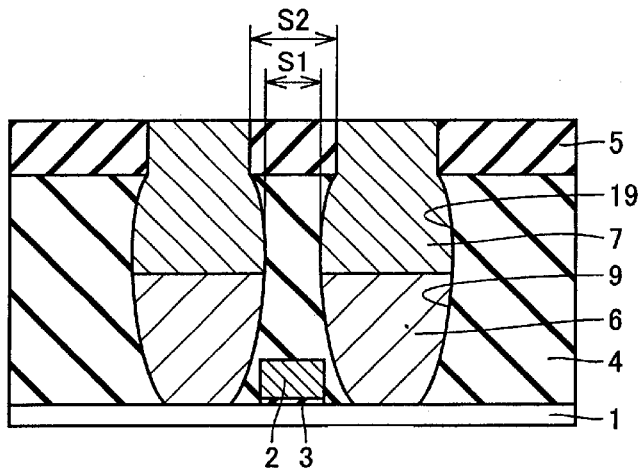
FIG. 26 is a partial cross-sectional view of the memory cell of the SRAM according to the sixth embodiment of the present invention.

FIG. 26 shows an example of a cross-sectional structure of the MOS transistor and peripheral portions according to the sixth embodiment. As shown in FIG. 26, in a portion in which contact hole 9 is formed, trench 19 is continuously formed on contact hole 9, and the upper end of contact hole 9 and the bottom portion of trench 19 are connected to each other.

In the example shown in FIG. 26, trench 19 penetrates interlayer insulator film 5 of the upper layer and reaches interlayer insulator film 4 of the lower layer, and is expanded in the lateral direction in interlayer insulator film 4. Contact hole 9 is also expanded in the lateral direction in interlayer insulator film 4. Therefore, not only space S1 between plug portions 6 but also the space between metal interconnections 7 can be made smaller, and the capacity between metal interconnections 7 as well as the capacity between plug portions 6 can increase. As a result, a capacity larger than that in each embodiment described above can be added between the source and drain of the transistor. Other structures are similar to those in the first embodiment.

A manufacturing method of the MOS transistor and peripheral portions within the memory cell of the SRAM shown in FIG. 26 will be described with reference to FIGS. 27A, 27B and FIGS. 28A, 28B.

Figure 27A:
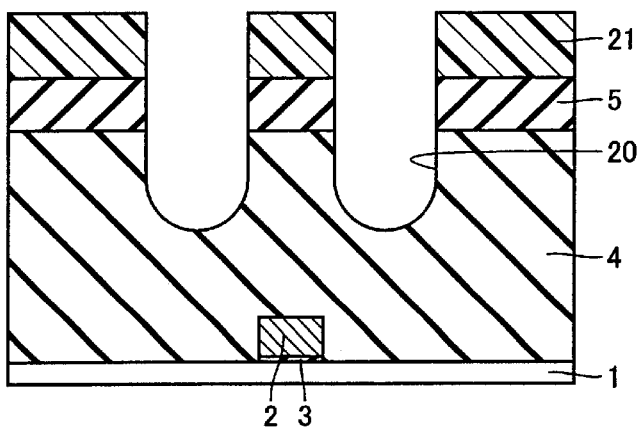
FIG. 27A is a cross-sectional view of a first step in a manufacturing process of the memory cell of the SRAM shown in FIG. 26.
Figure 27B:
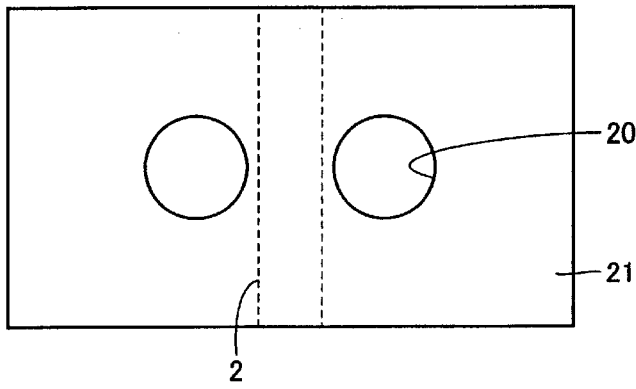
FIG. 27B is a plan view thereof.

As shown in FIG. 27A, insulator film 3, gate electrode 2, the source and drain (impurity regions), and interlayer insulator films 4, 5 are formed with steps similar to that in the first embodiment. As shown in FIG. 27B, a resist pattern 21, which has an opening (through hole) on a position corresponding to contact hole 9 formed afterwards, is formed on interlayer insulator film 5.

Anisotropic etching is performed using resist pattern 21 as a mask, and a concave portion 20 is formed. In the example shown in FIG. 27A, the anisotropic etching is stopped in an intermediate portion of interlayer insulator film 4 to form concave portion 20 having a bottom surface within interlayer insulator film 4.

Figure 28A:
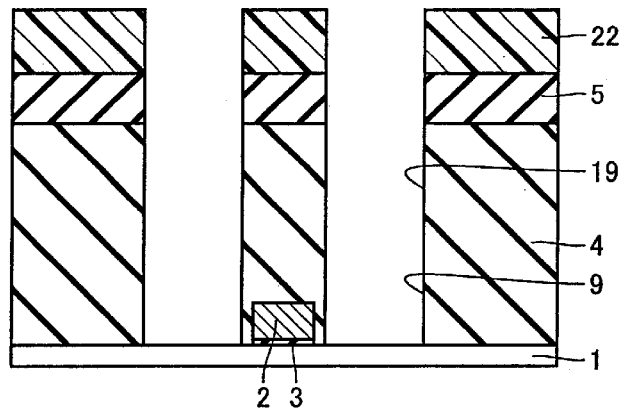
FIG. 28A is a cross-sectional view of a second step in the manufacturing process of the memory cell of the SRAM shown in FIG. 26.
Figure 28B:
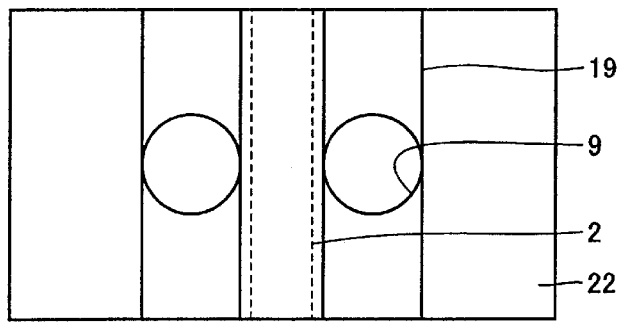
FIG. 28B is a plan view thereof.

After resist pattern 21 is removed, a resist pattern 22 is further formed on interlayer insulator film 5. Resist pattern 22 has an opening (through hole) on a position corresponding to trench 19 formed afterwards. Anisotropic etching is performed using resist pattern 22 as a mask. As shown in FIGS. 28A, 28B, with this step, trench 19 penetrating interlayer insulator film 5 and reaching interlayer insulator film 4 is formed in a portion not formed with concave portion 20, while contact hole 9 reaching a main surface of semiconductor substrate 1 is formed in a portion formed with concave portion 20 by further etching the bottom surface of concave portion 20. As a result, trench 19 communicating with contact hole 9 and opening on a surface of interlayer insulator film 5 can be formed.

Thereafter, isotropic etching is performed as in the first embodiment. With this step, contact hole 9 as well as a lower end portion of trench 19 can be expanded in the lateral direction in interlayer insulator film 4, as shown in FIG. 26.

In this state, a conductive material is embedded in contact hole 9 and trench 19 using a method such as the CVD method or a combination of CVD and plating methods. A surface of the conductive material is then polished with the CMP method or the like. With this step, plug portion 6 can be formed within contact hole 9 and metal interconnection 7 can be embedded in trench 19, as shown in FIG. 26. Though plug portion 6 and metal interconnection 7 are made of different materials in the example shown in FIG. 26, these can also be formed with the same material.

When plug portion 6 and metal interconnection 7 are made of different materials, it is contemplated to select as plug portion 6 a material such as tungsten which can easily be filled in contact hole 9, and to select as metal interconnection 7 a material such as copper or copper alloy which has low resistance. When plug portion 6 and metal interconnection 7 are made of the same material, on the other hand, it is contemplated to form plug portion 6 and metal interconnection 7 with tungsten or the like.

Though an example in which the present invention is applied to a connective portion between the interconnection layer and the substrate is described in each of the above-described embodiments, the present invention can be applied to a set of connective portions connecting conductive portions. The present invention can be applied, for example, to a connective portion connecting interconnections with each other. In addition, though the contact hole is described as an example of the connection hole, the present invention can also be applied to a through hole. Further, the isotropic etching to expand the connection hole in the lateral direction may be performed with leaving the resist pattern used as a mask for anisotropic etching.

Though each embodiment of the present invention is described above, it is also intended to appropriately combine the features of the embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static type semiconductor memory device, comprising:
    a memory cell;
    first and second conductive portions formed within said memory cell;
    an interlayer insulator film covering said first and second conductive portions;
    first and second connection holes provided in said interlayer insulator film and reaching said first and second conductive portions;
    first and second plug portions formed within said first and second connection holes; and
    third and fourth conductive portions respectively formed on said first and second plug portions; wherein
    a space between said first and second connection holes located in said interlayer insulator film is made smaller than a space between said first and second connection holes on a surface of said interlayer insulator film.

2. The static type semiconductor memory device according to claim 1, wherein
    widths of said first and second connection holes in said interlayer insulator film are larger than that of said first and second connection holes on a surface of said interlayer insulator film.

3. The static type semiconductor memory device according to claim 1, wherein
    said first and second conductive portions include a set of impurity regions formed in a main surface of a semiconductor substrate, and said third and fourth conductive portions include an interconnection, and said static type semiconductor memory device further comprises
    a gate electrode formed on a portion of the main surface of the semiconductor substrate located between said set of impurity regions via an insulator film.

4. The static type semiconductor memory device according to claim 3, wherein
    said interlayer insulator film includes a first interlayer insulator film covering said gate electrode and a second interlayer insulator film covering said first interlayer insulator film, and
    said first interlayer insulator film is formed with a material having an etching rate greater than that of said second interlayer insulator film.

5. The static type semiconductor memory device according to claim 4, wherein
    a thickness of said first interlayer insulator film is made larger than that of said second interlayer insulator film.

6. The static type semiconductor memory device according to claim 3, wherein
    said interlayer insulator film includes a first interlayer insulator film covering said gate electrode and a second interlayer insulator film covering said first interlayer insulator film, and
    said first interlayer insulator film is formed with a material having a heat shrinkage ratio greater than that of said second interlayer insulator film.

7. The static type semiconductor memory device according to claim 3, wherein
    said interlayer insulator film includes a first interlayer insulator film covering said gate electrode, a second interlayer insulator film covering said first interlayer insulator film and a third interlayer insulator film covering said second interlayer insulator film, and said second interlayer insulator film is formed with a material having an etching rate greater than that of said first and third interlayer insulator films.

8. The static type semiconductor memory device according to claim 7, wherein a thickness of said second interlayer insulator film is made larger than that of said first and third interlayer insulator films.

9. The static type semiconductor memory device according to claim 3, wherein a space between said first and second connection holes located in said interlayer insulator film is smaller than a width of said gate electrode.

10. The static type semiconductor memory device according to claim 1, further comprising a protection insulator film formed on an inner surface of said first and second connection holes, wherein said first and second plug portions are formed on said protection insulator film.

11. The static type semiconductor memory device according to claim 10, wherein said protection insulator film is formed with a material having a permittivity higher than that of said interlayer insulator film.

12. The static type semiconductor memory device according to claim 1, further comprising first and second trenches formed in a surface of said interlayer insulator film and reaching said first and second connection hole, wherein said third and fourth conductive portions are embedded in said first and second trenches.

* * * * *